United States Patent
Kim (10) Patent No.: US 9,881,992 B2
(45) Date of Patent: Jan. 30, 2018

(54) SEMICONDUCTOR INTEGRATED CIRCUIT DEVICE HAVING WITH A RESERVOIR CAPACITOR

(71) Applicant: SK hynix Inc., Icheon-si, Gyeonggi-do (KR)

(72) Inventor: Ji Hwan Kim, Icheon-si (KR)

(73) Assignee: SK hynix inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/652,861

(22) Filed: Jul. 18, 2017

(65) Prior Publication Data

US 2017/0317160 A1    Nov. 2, 2017

Related U.S. Application Data

(62) Division of application No. 15/054,336, filed on Feb. 26, 2016, now Pat. No. 9,741,786.

(30) Foreign Application Priority Data

Nov. 16, 2015   (KR) .................. 10-2015-0160382

(51) Int. Cl.
  *H01L 27/105*  (2006.01)
  *H01L 49/02*   (2006.01)
  *H01L 23/48*   (2006.01)
  *H01L 23/528*  (2006.01)

(52) U.S. Cl.
  CPC ............ *H01L 28/60* (2013.01); *H01L 23/481* (2013.01); *H01L 23/5286* (2013.01); *H01L 27/105* (2013.01)

(58) Field of Classification Search
  CPC ... H01L 28/60; H01L 23/481; H01L 23/5286; H01L 27/105; H01L 23/5384; H01L 24/05; H01L 25/0657; H01L 28/40; H01L 2224/05025; H01L 2924/0002; H01L 2225/06541
  USPC ......... 257/621, 774; 438/629, 637, 672, 675
  See application file for complete search history.

(56) References Cited

U.S. PATENT DOCUMENTS

| | | |
|---|---|---|
| 2013/0026549 A1 | 1/2013 | Kim |
| 2014/0048907 A1* | 2/2014 | Yoon .................. H01L 23/5384 257/532 |
| 2014/0054742 A1* | 2/2014 | Katti .................. H01L 23/5223 257/503 |

* cited by examiner

*Primary Examiner* — Jarrett Stark
*Assistant Examiner* — Shahed Ahmed
(74) *Attorney, Agent, or Firm* — William Park & Associates Ltd.

(57) ABSTRACT

A semiconductor integrated circuit device may include a through silicon via (TSV), a keep out zone and a plurality of dummy patterns. The TSV may be arranged in a selection region of a semiconductor substrate. The keep out zone may be configured to define a peripheral region of the TSV. The dummy patterns may be arranged in the keep out zone to receive a conductive signal. The dummy patterns may function as an electrode of a reservoir capacitor.

6 Claims, 8 Drawing Sheets

SEMICONDUCTOR INTEGRATED CIRCUIT DEVICE HAVING WITH A RESERVOIR CAPACITOR

CROSS-REFERENCES TO RELATED APPLICATION

The present application is a divisional application of U.S. application Ser. No. 15/054,336, filed on Feb. 26, 2016, and claims priority under 35 U.S.C. § 119(a) to Korean application number 10-2015-0160382, filed on Nov. 16, 2015, in the Korean Intellectual Property Office, which is incorporated herein by reference in its entirety.

BACKGROUND

1. Technical Field

Various embodiments generally relate to a semiconductor integrated circuit device, more particularly, to a semiconductor integrated circuit device with a reservoir capacitor capable of reducing an integration density.

2. Related Art

Recently, principal factors for determining capacities of semiconductor integrated circuit devices may include a high integration degree, low power consumption, a high speed, etc. The semiconductor integrated circuit device may require a low voltage and various levels of power. However, when the power is supplied to the semiconductor integrated circuit device, noises may be transmitted to the semiconductor integrated circuit device together with the power. The noises may change signal transmission characteristics of the device, i.e., a delay value.

In order to remove the noises, a reservoir capacitor may be formed in a peripheral region of the semiconductor integrated circuit device. The reservoir capacitor may include a conductive layer, a dielectric layer and a conductive layer sequentially stacked on the peripheral region. However, in order to supply stable power to the reservoir capacitor, it may be required to provide the reservoir capacitor with a large capacity.

SUMMARY

According to an embodiment, there may be provided a semiconductor integrated circuit device. The semiconductor integrated circuit device may include a through silicon via (TSV), a keep out zone and a plurality of dummy patterns. The TSV may be arranged in a selection region of a semiconductor substrate. The keep out zone may be configured to define a peripheral region of the TSV. The dummy patterns may be arranged in the keep out zone to receive a conductive signal.

According to an embodiment, there may be provided a semiconductor integrated circuit device. The semiconductor integrated circuit device may include a semiconductor substrate, a through silicon via (TSV), an isolation region, a keep out zone and a plurality of power mesh lines. The semiconductor substrate may include bank regions and a peripheral region arranged between the bank regions. The TSV may be vertically formed through a selection region of a semiconductor substrate. The isolation region may be configured to surround an upper portion of the TSV. The keep out zone may be arranged on an outer surface of the isolation region. A plurality of dummy patterns may be arranged in the keep out zone. The power mesh lines may be extended over the semiconductor substrate. The dummy patterns may be connected to at least one of the power mesh lines to be operated as an electrode of the reservoir capacitor.

According to example embodiments, the dummy patterns may be formed in the keep out zone configured to surround the TSV. The dummy patterns may receive conductivity from the power mesh line so that the dummy pattern may be used as the electrode of the reservoir capacitor. Thus, the keep out zone, which may be filled with a simple dummy pattern or may not be used, may be used for the reservoir capacitor so that the semiconductor integrated circuit device may have improved integration density.

DETAILED DESCRIPTION

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

Figure 1:
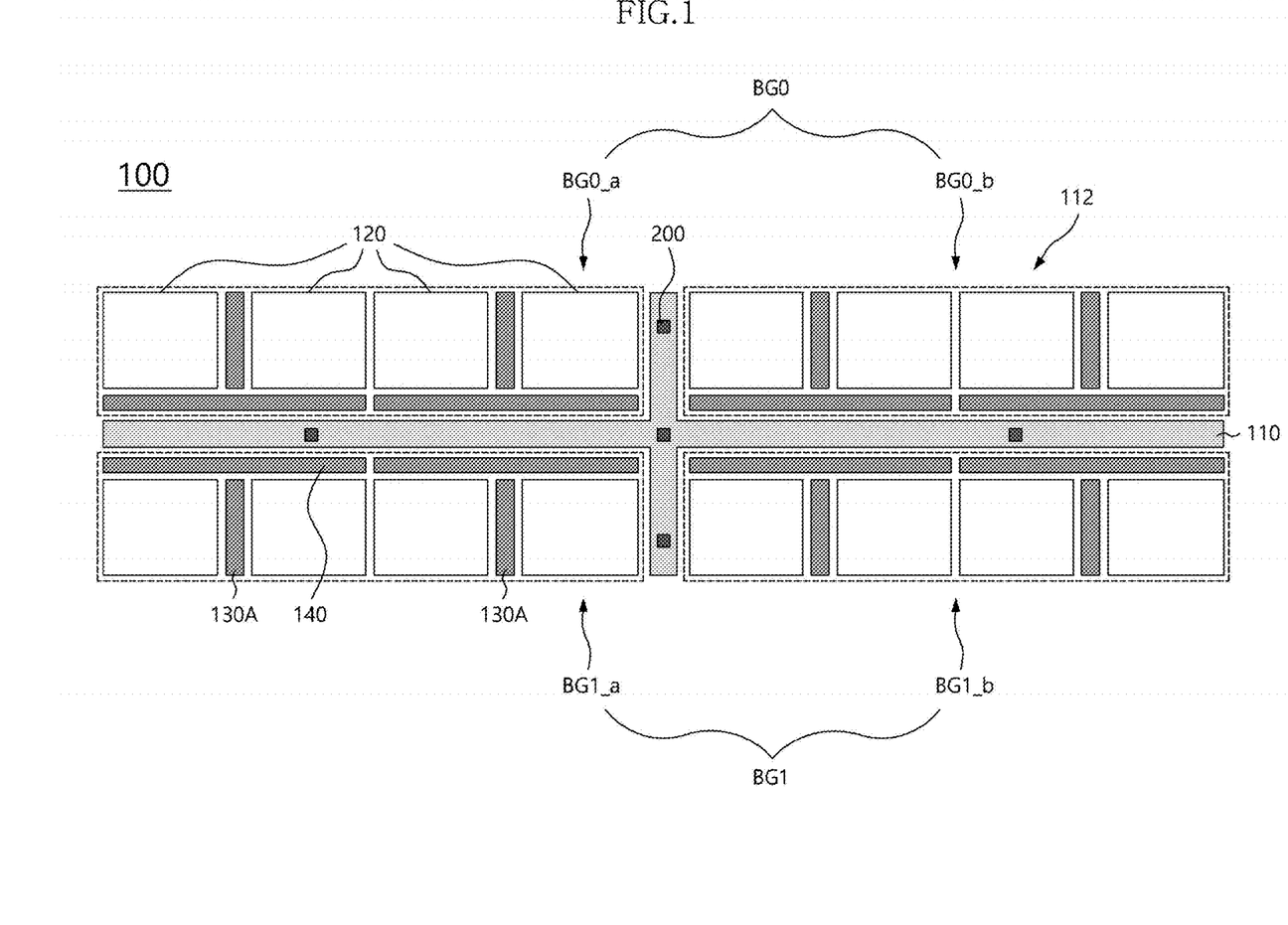
FIG. 1 is a plan view illustrating a semiconductor integrated circuit device in accordance with example embodiments.

FIG. 1 is a plan view illustrating a semiconductor integrated circuit device in accordance with example embodiments.

Referring to FIG. 1, a semiconductor integrated circuit device 100 of this example embodiment may include a plurality of bank regions or bank groups BG0 and BG1, and a peripheral circuit region 110.

The bank groups may be classified into up-ranked bank groups BG0 and down-ranked bank groups BG1. The up-ranked bank groups BG0 and the down-ranked bank groups BG1 may be symmetrically arranged with respect to the peripheral circuit region 110.

The up-ranked bank groups BG0 may be classified into first up-ranked bank groups BG0_a and second up-ranked bank groups BG0_b with respect to the peripheral circuit region 110. The down-ranked bank groups BG1 may be classified into first down-ranked bank groups BG1_a and second down-ranked bank groups BG1_b with respect to the peripheral circuit region 110.

The first and second up-ranked bank groups BG0_a and BG0_b and the first and second down-ranked bank groups BG1_a and BG1_b may have substantially the same structure. Hereinafter, the first and second up-ranked bank groups BG0_a and BG0_b and the first and second down-ranked bank groups BG1_a and BG1_b may be referred to as a bank group unit.

The bank group unit BG0_a, BG0_b, BG1_a and BG1_b may include a plurality of banks 120. A row decoder block 130A and a column decoder block 140 may be arranged in a peripheral region of the bank 120 in the bank group unit BG0_a, BG0_b, BG1_a and BG1_b. Arrangements of the bank 120 and positions of the row decoder 130A and the column decoder 140 may be changed in accordance with designs and an integration degree of the semiconductor integrated circuit device 100.

A through silicon via (TSV) 200 may be arranged in a region of a semiconductor substrate 112 corresponding to the peripheral circuit region 110. The TSV 200 may be formed through the semiconductor substrate 112.

Figure 2:
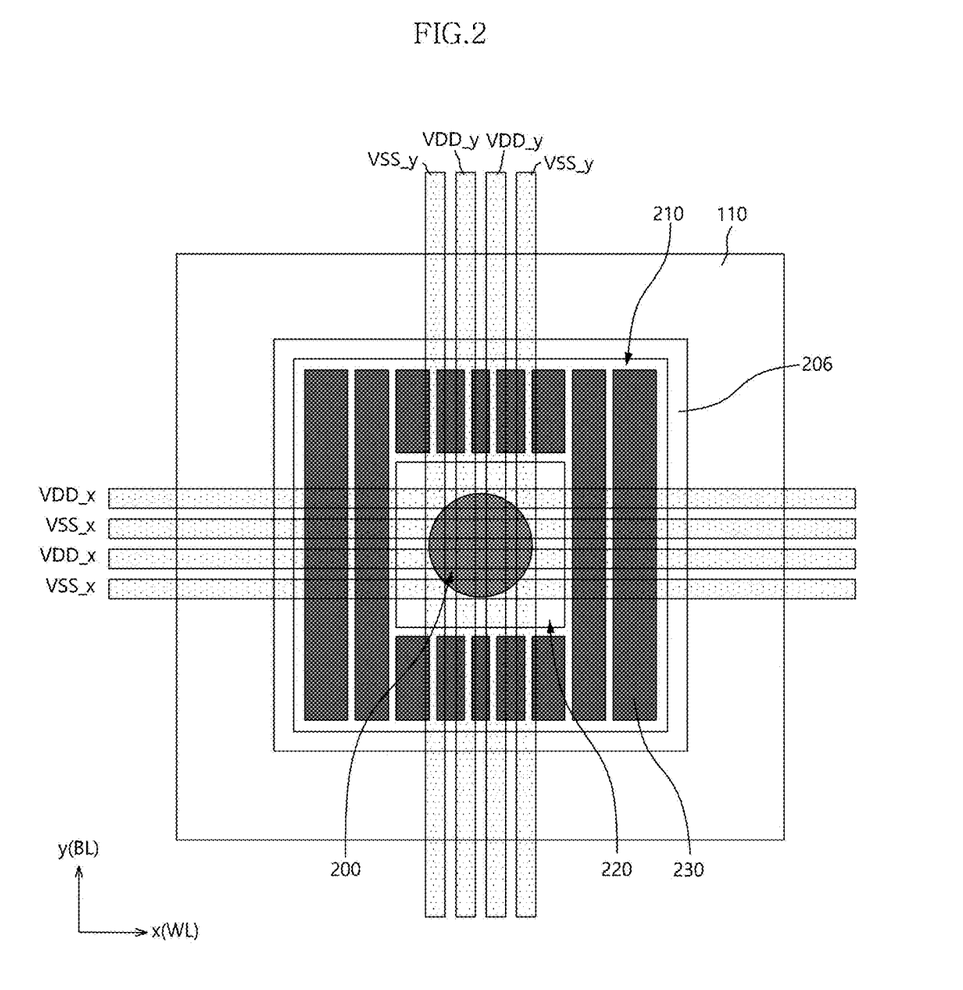
FIG. 2 is an enlarged plan view illustrating a peripheral region of a TSV in accordance with example embodiments.

FIG. 2 is an enlarged plan view illustrating a peripheral region of a TSV in accordance with example embodiments.

Referring to FIG. 2, the TSV 200 may be positioned in a region defined by a keep out zone 210 within the peripheral circuit region 110. The keep out zone 210 may define a peripheral region of the TSV 200. The TSV 200 may be located in a central portion of the keep out zone 210. Further, the TSV 200 may be formed through a selection region 206. An isolation region 220 may be configured to surround at least an upper portion of the TSV 200 and may be formed in the keep out zone 210. The isolation region 220 may function as to electrically isolate the conductive TSV 200 from the keep out zone 210 including a semiconductor material.

A plurality of dummy patterns 230 may be formed in the keep out zone 210 outside of the isolation region 220. The isolation region 220 may surround the TSV 200 which may be electrically isolated from the dummy patterns 230 from the TSV 200. The dummy patterns 230 may include a conductive material substantially the same as a material of a gate in a transistor that may be formed in the bank 120 or the peripheral circuit region 110. The dummy patterns 230 may include doped polysilicon. The dummy patterns 230 may be formed simultaneously with a gate of the transistor. For example, the dummy patterns 230 may include wirings extending in a y-direction. The wirings may be spaced apart from each other. Further, the dummy patterns 230 in the keep out zone 210 may have different lengths and different widths.

Power mesh lines VDD_x, VDD_y, VSS_x and VSS_y may be formed in the peripheral circuit region 110 in which the TSV 200 and the dummy patterns 230. The power mesh lines VDD_x, VDD_y, VSS_x and VSS_y may extend in an x-direction and the y-direction over the semiconductor substrate 112. For example, the x-direction may correspond to an extending direction of a word line WL in the bank 120 and the y-direction may correspond to an extending direction of a bit line BL in the bank 120. A first voltage line VDD_x and a second voltage line VSS_x may correspond to the power mesh lines that extend in the x-direction. A third voltage line VDD_y and a fourth voltage line VSS_y may correspond to the power mesh lines that extend in the y-direction. The first and second voltage lines corresponding to the power mesh line VDD_x and VSS_x that extend in the x-direction may be placed on a plane different from a plane on which the third and fourth voltage lines corresponding to the power mesh line VDD_y and VSS_y that extend in the y-direction may be placed. Further, the first and second voltage lines may overlap the third and fourth voltage lines. The power mesh lines VDD_x and VSS_x that extend in the x-direction may be electrically isolated from each other and from the power mesh lines VDD_y and VSS_y that extend in the y-direction. The power mesh lines VDD_y and VSS_y may also be electrically isolated from each other. That is, an insulating layer may be interposed between the power mesh line VDD_x and VSS_x that extends in the x-direction and the power mesh line VDD_y and VSS_y that extends in the y-direction.

The dummy patterns 230 may be electrically connected to any one of the power mesh lines VDD_x, VDD_y, VSS_x and VSS_y to receive a conductive signal, such as an electrical signal. Thus, the dummy patterns 230 may function as the electrode of the reservoir capacitor. The dummy patterns 230 may extend in a direction substantially parallel to an extending direction of at least some of the power mesh lines, for example, VSS_y and VDD_y. Further, the dummy patterns 230 may extend in a direction substantially perpendicular to an extending direction of at least some of the power mesh lines, for example, VSS_x and VDD_x.

Figure 3:
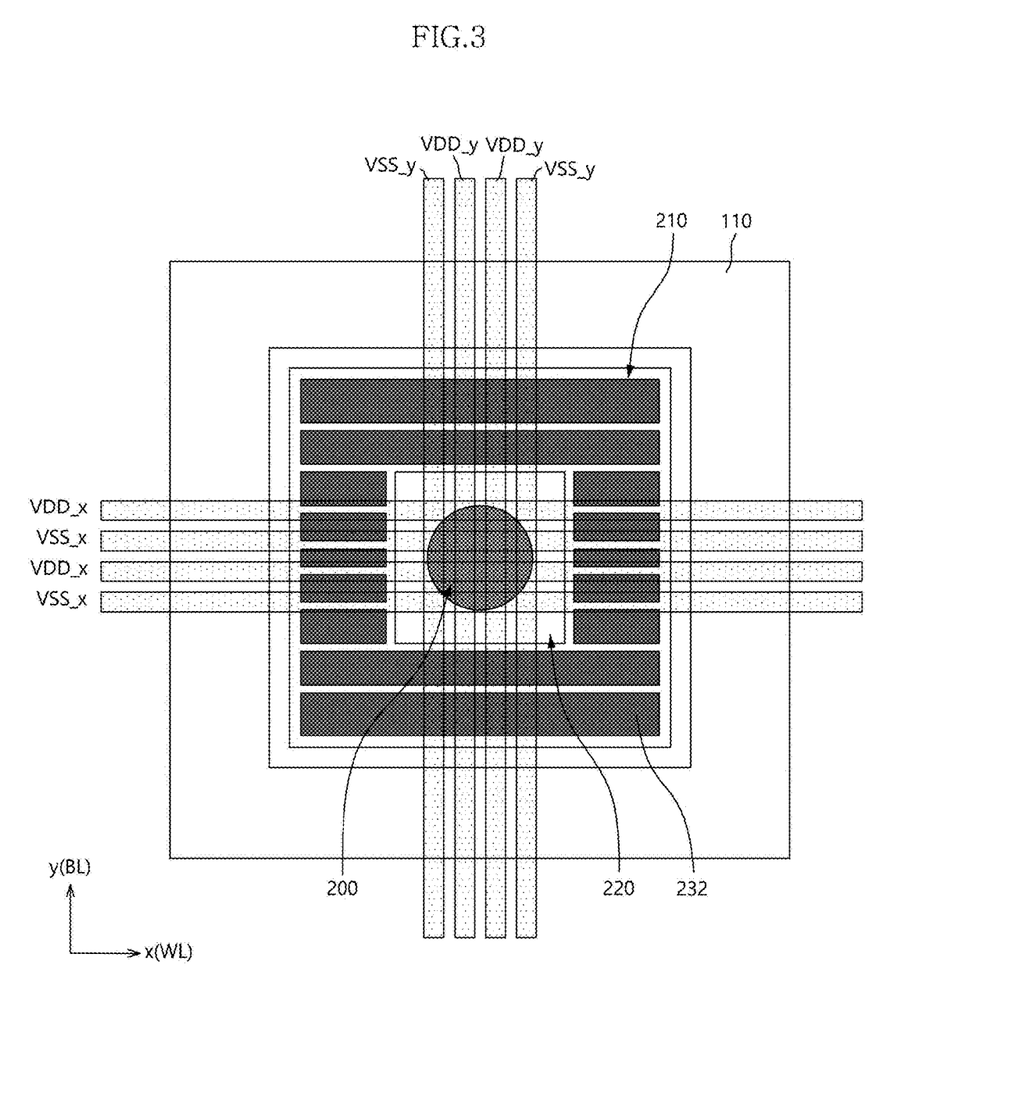
FIG. 3 is an enlarged plan view illustrating a peripheral region of a TSV in accordance with example embodiments.

FIG. 3 is an enlarged plan view illustrating a peripheral region of a TSV in accordance with example embodiments.

Referring to FIG. 3, dummy patterns 232 may be extended in the x-direction, i.e., the extending direction of the word line. The dummy patterns 232 may have various lengths and widths. The dummy patterns 232 may be connected to any one of the power mesh lines VDD_x, VDD_y, VSS_x and VSS_y. Thus, the dummy patterns 232 may function as the electrode of the reservoir capacitor.

Figure 4:
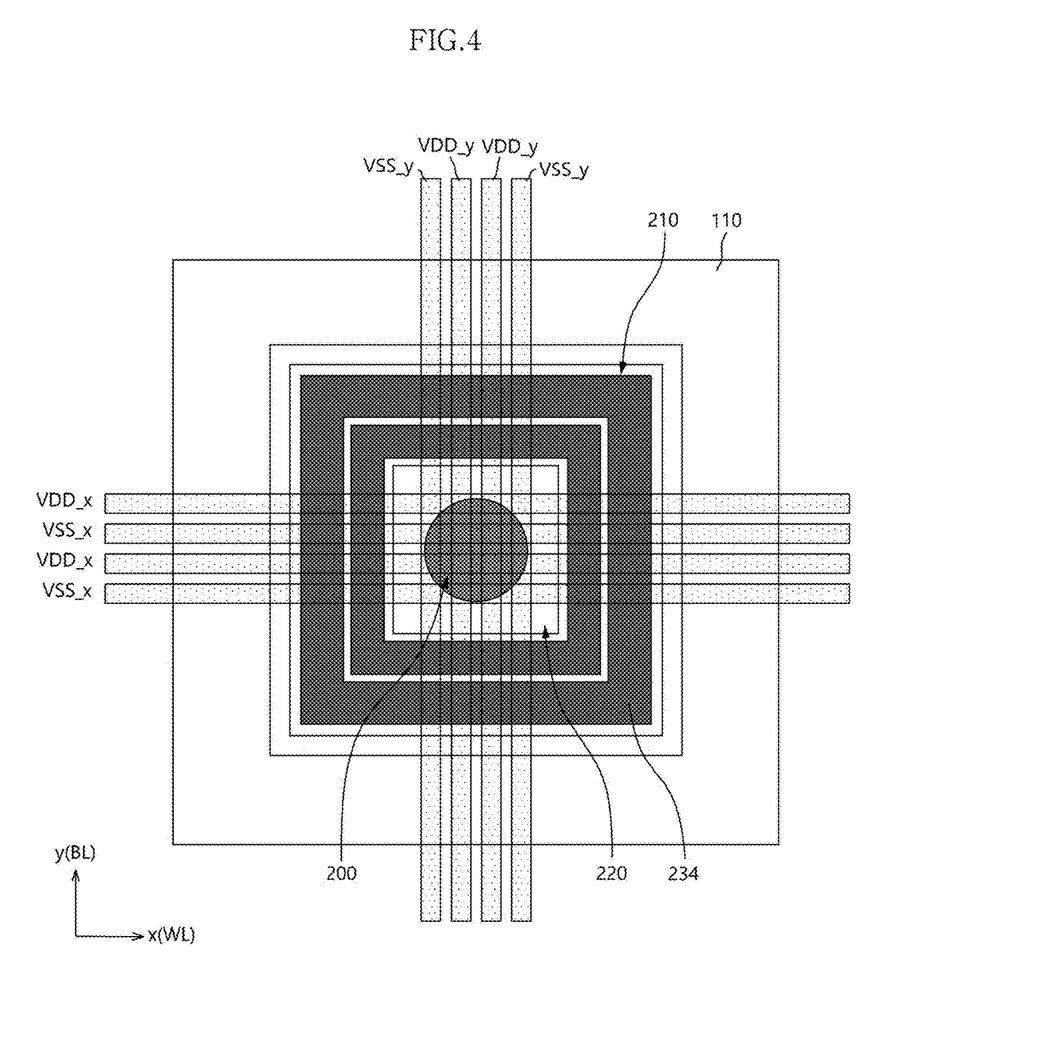
FIG. 4 is an enlarged plan view illustrating a peripheral region of a TSV in accordance with example embodiments.

FIG. 4 is an enlarged plan view illustrating a peripheral region of a TSV in accordance with example embodiments.

Referring to FIG. 4, dummy patterns 234 may have a frame shape. In one example the frame may be formed to have concentric square or rectangular shapes. The dummy patterns 234 may be connected to any one of the power mesh lines VDD_x, VDD_y, VSS_x and VSS_y. Illustratively, at least one of the power mesh lines VDD_x, VDD_y, VSS_x and VSS_y may be parallel with and perpendicular to sides of the dummy patterns 234. Thus, the dummy patterns 234 may function as the electrode of the reservoir capacitor. In this example embodiment, the dummy patterns 234 may have a closed frame shape. Alternatively, the dummy patterns 234 may have an opened frame shape.

According to example embodiments, the dummy patterns may be formed in the keep out zone configured to surround the TSV. The dummy patterns may receive conductivity from the power mesh line so that the dummy patterns may be used as an electrode of the reservoir capacitor. Thus, the keep out zone, which may be filled with a simple dummy pattern or may not be used, may be used as the reservoir capacitor so that the semiconductor integrated circuit device may have improved integration density.

Further, the dummy patterns in the keep out zone may decrease a stepped portion generated in the semiconductor substrate.

In this example embodiment, the TSV may be arranged in the peripheral circuit region. Alternatively, the TSV and the dummy patterns may be arranged in the bank region.

Figure 5:
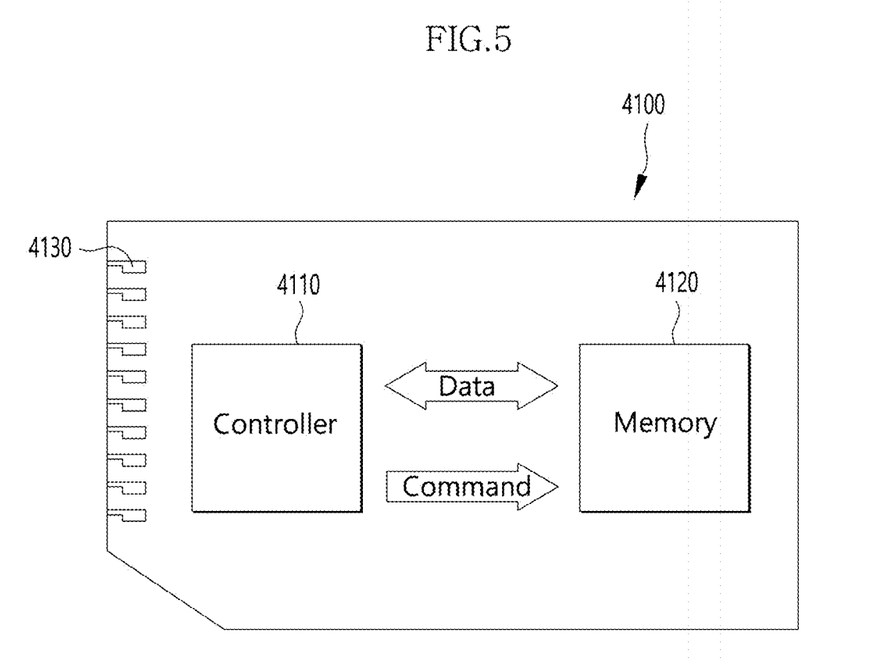
FIG. 5 is a schematic diagram illustrating a representation of an example of a representation of an example of a memory card according to an embodiment of the present disclosure.

FIG. 5 is a schematic diagram illustrating a representation of an example of a memory card having a semiconductor integrated circuit device according to various embodiments of the present disclosure.

Referring to FIG. 5, a memory card system 4100 including a controller 4110, a memory 4120, and an interface member 4130 may be provided. The controller 4110 and the memory 4120 may be configured to exchange a command and/or data. For example, the memory 4120 may be used to store a command to be executed by the controller 4110 and/or user data.

The memory card system 4100 may store data in the memory 4120 or output data from the memory 4120 to the outside. The memory 4120 may include the semiconductor integrated circuit device according to any one of the above-described embodiments. The controller 4110 may transmit a test command to a probe test pad in an embodiment of the inventive concept. Further, a non-contact test between the probe test pad and a probe card may be performed.

The interface member 4130 may function to input and output data from and to the outside. The memory card system 4100 may be a multimedia card (MMC), a secure digital card (SD) or a portable data storage device.

Figure 6:
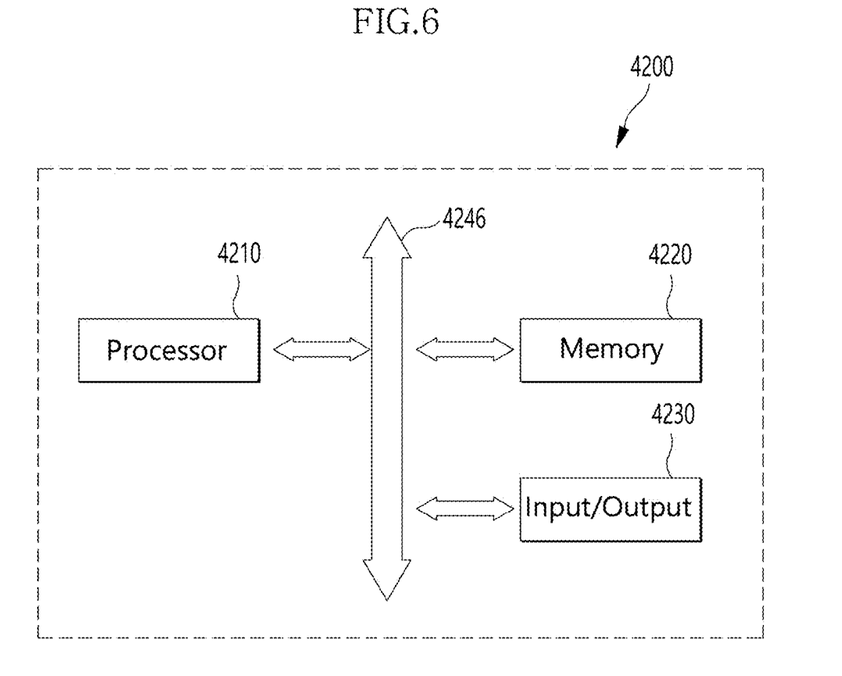
FIG. 6 is a block diagram illustrating a representation of an example of an electronic system according to an embodiment of the present disclosure.

FIG. 6 is a block diagram illustrating a representation of an example of an electronic apparatus having a semiconductor integrated circuit device according to various embodiments of the disclosure.

Referring to FIG. 6, an electronic apparatus 4200 including a processor 4210, a memory 4220, and an input/output (I/O) device 4230 may be provided. The processor 4210, the memory 4220, and the I/O device 4230 may be electrically coupled through a bus 4246.

The memory 4220 may receive a control signal from the processor 4210. The memory 4220 may store a code and data for operation of the processor 4210. The memory 4220 may be used to store data to be accessed through the bus 4246.

The memory 4220 may include the semiconductor integrated circuit device according to any one of the above-described embodiments. In order for detailed realization and modification, additional circuits and control signals may be provided.

The electronic apparatus 4200 may constitute various electronic control apparatuses which need the memory 4220. For example, the electronic apparatus 4200 may be used in a computer system or a wireless communication device, such as a personal digital assistant (PDA), a laptop computer, a portable computer, a web tablet, a wireless phone, a portable phone, a digital music player, an MP3 player, a navigator, a solid state disk (SSD), a household appliance, or any device capable of transmitting and receiving wireless information.

Descriptions will be made below for the realization and modified examples of the electronic apparatus 4200, with reference to FIG. 7.

Figure 7:
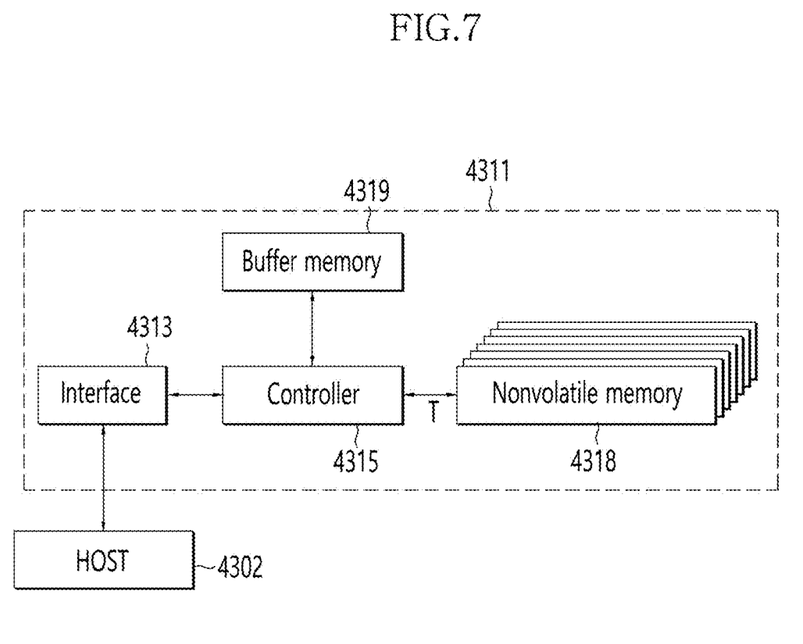
FIG. 7 is a block diagram illustrating a representation of an example of a data storage apparatus according to an embodiment of the present disclosure.

FIG. 7 is a block diagram illustrating a representation of an example data storage apparatus having a semiconductor integrated circuit device according to various embodiments of the disclosure.

Referring to FIG. 7, a data storage apparatus 4311 such as a solid state disk (SSD) may be provided. The SSD 4311 may include an interface 4313, a controller 4315, a non-volatile memory 4318, and a buffer memory 4319.

The SSD 4311 may be an apparatus which stores information using a semiconductor device. The SSD 4311 may be faster, may have a lower mechanical delay or failure rate. The SSD 4311 may also generate less heat and noise than a hard disk drive (HDD). Further, the SSD 4311 may be smaller and lighter than the HDD. The SSD 4311 may be widely used in a laptop PC, a net book, a desktop PC, an MP3 player, or a portable storage device.

The controller 4315 may be formed adjacent to the interface 4313 and may be electrically coupled to the interface 4313. The controller 4315 may be a microprocessor including a memory controller and a buffer controller.

The nonvolatile memory 4318 may be formed adjacent to the controller 4315 and may be electrically coupled to the controller 4315 via a connection terminal T. The data storage capacity of the SSD 4311 may correspond to the nonvolatile memory 4318. The buffer memory 4319 may be formed adjacent to the controller 4315 and may be electrically coupled to the controller 4315.

The interface 4313 may be electrically coupled to a host 4302. The interface 4313 may also function to transmit and receive electrical signals such as data to and from the host 4302. For example, the interface 4313 may be a device which uses the same standard as SATA, IDE, SCSI, and/or a combination thereof. The nonvolatile memory 4318 may be electrically coupled to the interface 4313 via the controller 4315.

The nonvolatile memory 4318 may function to store data received through the interface 4313.

The nonvolatile memory 4318 may include the semiconductor integrated circuit device according to any one of the above-described embodiments. The nonvolatile memory 4318 has a characteristic that stored data is retained even when power supply to the SSD 4311 is interrupted.

The buffer memory 4319 may include a volatile memory. The volatile memory may be a DRAM and/or an SRAM. The buffer memory 4319 has a relatively higher operation speed than the nonvolatile memory 4318.

The data processing speed of the interface 4313 may be relatively faster than the operation speed of the nonvolatile memory 4318. The buffer memory 4319 may function to temporarily store data. The data received through the interface 4313 may be temporarily stored in the buffer memory 4319 via the controller 4315. Further, data may then be permanently stored in the nonvolatile memory 4318 in conformity with the data recording speed of the nonvolatile memory 4318.

The data frequently used among the data stored in the nonvolatile memory 4318 may be read in advance and may be temporarily stored in the buffer memory 4319. Namely, the buffer memory 4319 may function to increase the effective operation speed of the SSD 4311 and reduce an error occurrence rate.

Figure 8:
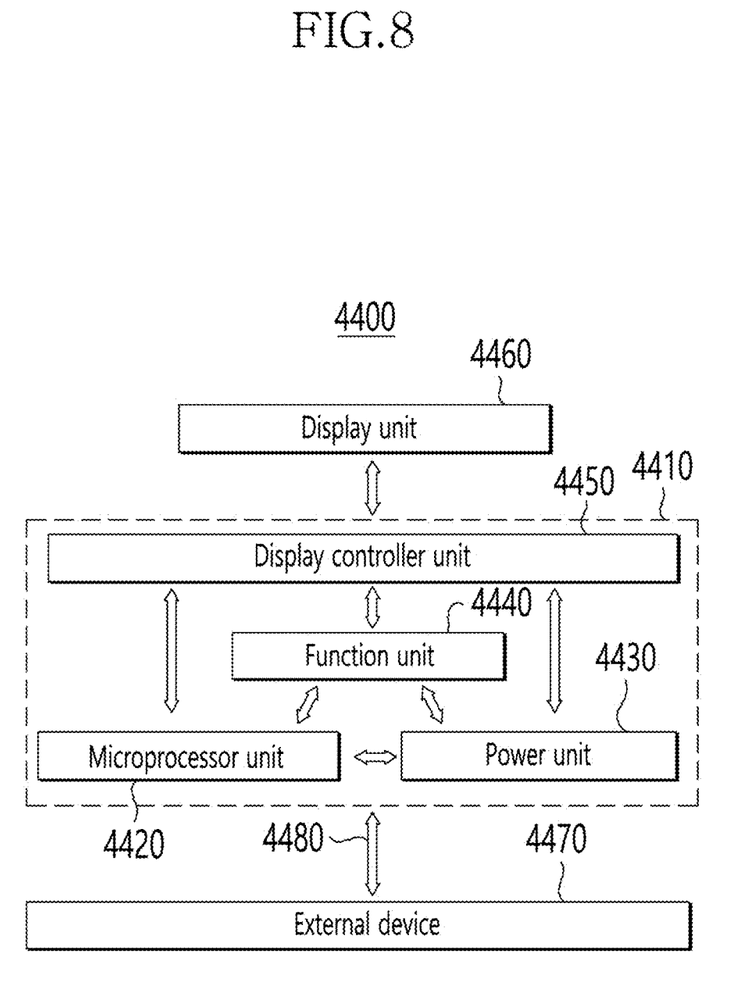
FIG. 8 is a block diagram illustrating a representation of an example of an electronic apparatus according to an embodiment of the present disclosure.

FIG. 8 is a system block diagram illustrating a representation of an example of an electronic apparatus having a semiconductor integrated circuit device according to various embodiments of the disclosure.

Referring to FIG. 8, an electronic system 4400 including a body 4410, a microprocessor unit 4420, a power unit 4430, a function unit 4440, and a display controller unit 4450 may be provided.

The body 4410 may be a mother board formed of a printed circuit board (PCB). The microprocessor unit 4420, the power unit 4430, the function unit 4440, and the display controller unit 4450 may be mounted on the body 4410. A display unit 4460 may be disposed inside the body 4410 or outside the body 4410. For example, the display unit 4460 may be disposed on a surface of the body 4410. The display unit 4460 may also display images processed by the display controller unit 4450.

The power unit 4430 may function to receive a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430 and control the function unit 4440 and the display unit 4460. The function unit 4440 may perform various functions of the electronic system 4400. For example, when the electronic system 4400 is a portable phone, the function unit 4440 may include various components capable of performing portable phone functions, such as output of an image to the display unit 4460 or output of a voice to a speaker, by dialing or communication with an external device 4470. When a camera is mounted on the body 4410, the function unit 4440 may serve as a camera image processor.

When the electronic system 4400 is electrically coupled to a memory card or the like to increase capacity, the function unit 4440 may be a memory card controller. The function unit 4440 may exchange signals with the external device 4470 through a wired or wireless communication unit 4480. When the electronic system 4400 needs a universal serial bus (USB) or the like to expand functions, the function unit 4440 may serve as an interface controller. Any one semiconductor integrated circuit device among the semiconductor integrated circuit devices according to the above-described embodiments may be applied to at least any one of the microprocessor unit 4420 and the function unit 4440.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
   a semiconductor substrate having bank regions and a peripheral circuit region between the bank regions;
   a keep out zone configured to be defined within the peripheral circuit region;
   a through silicon via (TSV) formed at the keep out zone and through a selection region of the semiconductor substrate;
   an isolation region formed in the keep out zone to surround an upper portion of the TSV;
   dummy patterns formed in the keep out zone outside of the isolation region, wherein the dummy patterns are isolated from the TSV by the isolation region; and
   a plurality of power mesh lines that extend over the semiconductor substrate,
   wherein the dummy patterns are connected to at least one of the power mesh lines to function as an electrode of a reservoir capacitor.

2. The semiconductor integrated circuit device of claim 1, wherein the dummy patterns extend in a direction substantially parallel to an extending direction of at least one of the power mesh lines.

3. The semiconductor integrated circuit device of claim 1, wherein the power mesh lines comprise:
   a first voltage line and a second voltage line extending in a first direction; and
   a third voltage line and a fourth voltage line extending in a second direction substantially perpendicular to the first direction,
   wherein the first to fourth voltage lines are electrically isolated from each other.

4. The semiconductor integrated circuit device of claim 3, wherein the third voltage line and the fourth voltage line overlap with the first voltage line and the second voltage line.

5. The semiconductor integrated circuit device of claim 1, wherein each of the dummy patterns has a frame shape.

6. The semiconductor integrated circuit device of claim 1, wherein the dummy patterns comprises a conductive material substantially the same as a conductive material of a gate of a transistor formed in the bank regions and a peripheral circuit.

* * * * *